United States Patent [19]
Gruenwald et al.

[11] Patent Number: 5,916,407
[45] Date of Patent: Jun. 29, 1999

[54] PROCESS FOR PRODUCING AN ELECTRICALLY CONDUCTIVE CONNECTION

[75] Inventors: Werner Gruenwald, Gerlingen; Ralf Haug, Leonberg; Thomas Burkhart, Dahn; Martin Mennig, Fischbach; Helmut Schmidt, Saarbruecken, all of Germany

[73] Assignee: Robert Bosch GmbH, Stuttgart, Germany

[21] Appl. No.: 08/727,671

[22] PCT Filed: Jun. 27, 1995

[86] PCT No.: PCT/DE95/00830

§ 371 Date: Oct. 17, 1996

§ 102(e) Date: Oct. 17, 1996

[87] PCT Pub. No.: WO96/02955

PCT Pub. Date: Feb. 1, 1996

[30] Foreign Application Priority Data

Jul. 14, 1994 [DE] Germany .............................. 44 24 831

[51] Int. Cl.⁶ .............................. H01R 4/04; H05K 13/04
[52] U.S. Cl. .............................. 156/291; 29/739; 156/232; 156/235

[58] Field of Search .................................. 156/291, 232, 156/234, 235; 29/739

[56] References Cited

U.S. PATENT DOCUMENTS

| | | | |
|---|---|---|---|
| 4,231,830 | 11/1980 | Ryan | 156/232 |
| 4,353,977 | 10/1982 | Gerbes | 156/232 |
| 4,731,503 | 3/1988 | Kitanishi | 174/88 R |
| 4,829,663 | 5/1989 | Masujima | 29/740 |

FOREIGN PATENT DOCUMENTS

| | | |
|---|---|---|
| 2831984 | 2/1979 | Germany . |
| 3810285 | 10/1988 | Germany . |
| 4109363 | 9/1992 | Germany . |

*Primary Examiner*—Daniel Stemmer
*Attorney, Agent, or Firm*—Spencer & Frank

[57] ABSTRACT

A process for producing an electrically conductive connection between opposite arranged contact areas of two elements that are to be connected, by means of a hot-melt type adhesive formed of electrically conductive particles, which are dispersed in a thermoplastic base material. The hot-melt type adhesive (22) is applied purposely only to the contact areas (16) of at least one of the elements (10, 28, 42, 50) and that these elements are joined under the effects of heat.

7 Claims, 4 Drawing Sheets

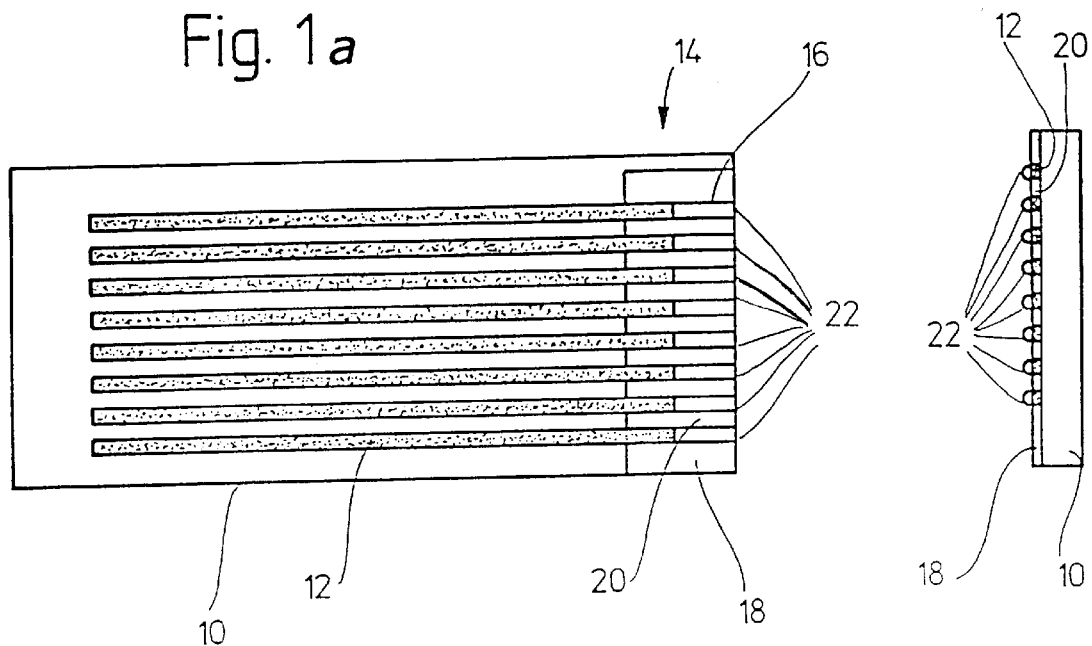
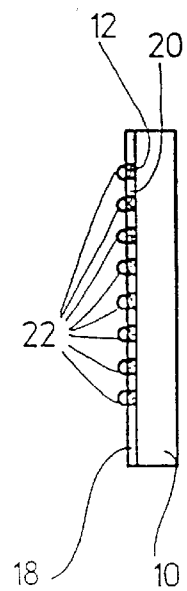
Fig. 1a
Fig. 1b
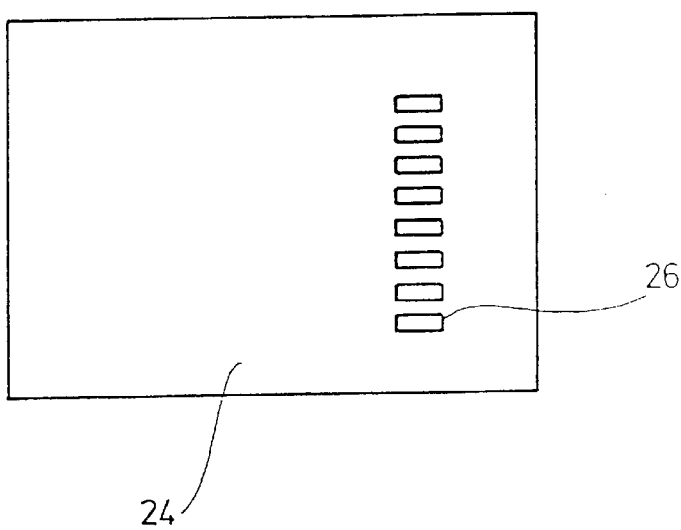
Fig. 2

PROCESS FOR PRODUCING AN ELECTRICALLY CONDUCTIVE CONNECTION

BACKGROUND OF THE INVENTION

The invention relates to a process for producing an electrically conductive connection between opposite arranged contact areas of two elements that must be connected using a hot-melt type adhesive with electrically conductive particles that are dispersed in a thermoplastic base material.

PRIOR ART

The production of electrically conductive connections between two elements with the aid of an electrically conductive hot-melt type adhesive is known, wherein here the term elements is understood to include, for example, electronic components, integrated circuits, printed circuits or the like, which have contact areas that are exposed on the surface area of the elements and are to be contacted. The electrically conductive hot-melt type adhesives have electrically conductive particles that are dispersed in a thermoplastic base material and which take over the electrically conductive connection between the contact areas of the elements to be connected. The contact areas in this case are joined under pressure and the effects of heat and by inserting the hot-melt type adhesive, so that the electrically conductive particles make contact with the respective contact areas and thus form an electrically conductive path. A disadvantage of the known processes is that the hot-melt type adhesive must be applied over a large surface, that is several adjoining contact areas, so that undesired short circuits between neighboring contacting areas can occur during the contacting of the elements via the conductive particles. Owing to this, only contacting areas with a relatively low resolution, that is a relatively large distance to each other, can be connected electrically conductive.

SUMMARY AND ADVANTAGES OF THE INVENTION

The above object generally is achieved according to the present invention by a process for producing an electrically conductive connection between opposite arranged contact areas of two elements that must be connected, by means of a hot-melt type adhesive with electrically conductive particles that are dispersed in a thermoplastic base material, wherein the hot-melt type adhesive is purposely applied only to the contact areas of at least one of the elements, and these elements are joined under the effects of heat to form the connections.

The above described process according to the invention, offers the advantage that contacting areas with a relatively small distance to each other, that is with a high resolution, can be contacted safely, without short circuits occurring between neighboring contacting areas. Owing to the fact that the hot-melt type adhesive is applied purposely only to the contact areas of at least one of the elements, it is advantageously possible to avoid wetting the areas between two neighboring contact areas of an element that are to be contacted with the hot-melt type adhesive. Thus, in these areas the electrically conductive particles, which are dispersed in the hot-melt type adhesive, cannot establish any lateral connections between the contact areas.

An advantageous embodiment of the invention provides that the areas between the contact areas are provided with a lyophobic layer, so that on the one hand a wetting of these areas through flowing hot-melt type adhesive is avoided during the application of the hot-melt type adhesive to the contact areas and, on the other hand, the hot-melt type adhesive while it is melting cannot wet these areas during the joining process of the two elements. Within the framework of the invention, a lyophobic layer generally is understood to be a fluid-rejecting layer or a layer that cannot be wetted with fluid.

In another advantageous embodiment of the invention, it is provided that the hot-melt adhesive applied to the contact areas is plastically patterned in such a way that structures result, which permit a self-adjustment of the elements during the joining process. This reduces a positioning expenditure for the situation-oriented positioning of two elements that are to be connected electrically conductive because the selection of the pattern results in an exact positioning of the contact areas opposite each other.

Further advantageous embodiments of the invention result from the other characteristics stated in the dependent claims.

BRIEF DESCRIPTION OF THE DRAWINGS

The invention is explained below in more detail with exemplary embodiments and with the corresponding drawings wherein:

FIGS. 1a and 1b are respectively, a view from above and a view from the side of a substrate with hot-melt type adhesive;

FIG. 2 is a mask for printing the adhesive;

DETAILED DESCRIPTION OF THE EXEMPLARY EMBODIMENTS

Figure 3:
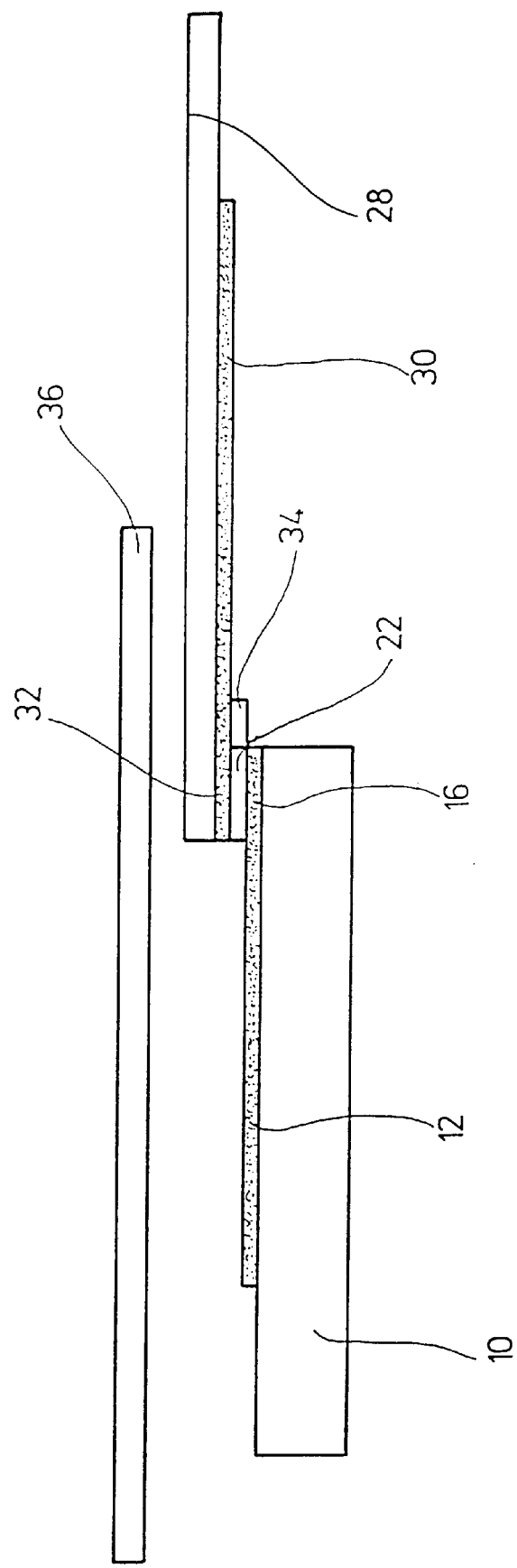
FIG. 3 is a connection of two elements.

FIGS. 1a and 1b shows a substrate 10 which, for example, can be a ceramic substrate. Electronic design elements that are not shown here can be arranged in or on the ceramic substrate 10, the contacts of which are conducted via strip conductors 12 to a connection area 14 of substrate 10. In the connection area 14, strip conductors 12 have contact areas 16. The contact areas 16 here are formed by segments of strip conductors 12. In the connection area 14, a lyophobic layer 18 is applied to the substrate 10, which covers the areas 20 between two neighboring contact areas 16 as well as the total adjoining connection areas 14 of contact areas 16. The contact areas 16 themselves are not covered with the lyophobic layer 18. A hot-melt type adhesive 22 with electrically conductive particles dispersed in a thermoplastic base material is applied to contact areas 16. This hot-melt type adhesive 22 can, for example, be printed onto contact areas 16 with the aid of the mask 24 shown in FIG. 2. For this, the mask 24 has a mask pattern 26 that corresponds to the layout of the contact areas 16. For the printing of hot-melt type adhesive 22, the mask 24 is positioned with its mask pattern 26 above the contact areas 16, so that the hot-melt type adhesive, that is applied to the top of the mask 24, for example as a paste, penetrates the mask pattern 26 and is thus applied pointedly to the contact areas 16, limited to the substrate 10. The mask 24 can, for example, be a metal mask with a lyophobic layer on the surface. This prevents a gluing together or wetting of the mask 24 with the hot-melt type adhesive. The mask 24 can, of course, also consist of any other suitable material.

The frontal view of the substrate 10 shown in FIG. 1a makes it clear that the hot-melt type adhesive 22 is applied exclusively to the contact areas 16 of strip conductors 12. The areas 20 between the strip conductors 12 are filled in with a lyophobic layer 18. The lyophobic layer 18 can, for example, consist of a fluorinated plastic material.

In accordance with an embodiment that is not shown, the hot-melt type adhesive 22 can also be applied photolithographically to the contact areas 16. To do this, the hot-melt type adhesive 22 is initially applied over the total connection area 14, for example by printing it on, and is subsequently patterned photolithographically via a respective mask, so that the hot-melt type adhesive 22 remains only on the contact areas 16.

FIG. 3 is an example of how a joined connection is produced. The substrate 10, which is explained in FIG. 1 already, is to be connected with another substrate 28 such that it conducts electrically. The substrate 28 can, for example, be a flexible contact foil through which electronic elements, which are arranged on the substrate 10, are to be connected with other equipment pieces, for example distribution panels, connector plugs or the like. For this, the substrate 28 also has strip connectors 30, the contact areas 32 of which are to be contacted with the contact areas 16 of the strip connectors 12. In this case, the contact areas 16 or 32 are arranged such that the areas that are to be contacted are facing each other. The substrate 28 is then positioned on substrate 10 in such a way that the contact areas 32 of the strip connector 30 come to rest on the hot-melt type adhesive 22, which was previously applied to the contact areas 16 of strip connectors 12. A positioning aid 34, which is indicated in FIG. 3 and is designed as a stop, can, for example, be used for this. The positioning aid can be formed, for example, by a lyophobic layer placed between the strip connectors of substrate 28.

The substrates 10 and 28 are joined under the effects of heat. An induction device 36, for example, serves here as heat source. This device 36 has an electric conductor through which a current flows and for which the magnetic field induces a voltage in the strip conductors 12 and 30 or their contact areas 16 and 32, which causes a current flow there. The contact areas 16 or 32 are heated via this current flow, so that the hot-melt type adhesive 22 between the contact areas 16 and 32 is heated above its melting temperature and therefore becomes liquid. As a result of the liquid state of the hot-melt type adhesive 22, the electrically conductive particles dispersed in it form an electrically conductive path from each of the contact areas 16 to each of the contact areas 32. Following the cooling and hardening of the hot-melt type adhesive 22, an electrically conductive connection is established between the strip conductors 12 and the strip conductors 30, wherein the hardened base material of the hot-melt melt type adhesive 22 at the same time also ensures a mechanical coupling of the substrate 10 to the substrate 28. On the whole, it is possible in this way to produce an electrically conductive adhesive connection between the substrates 10 and 28 through a simple process. Owing to the fact that the areas 20 between the contact areas 16 are covered with a lyophobic layer 18, a very high contact safety is ensured. Thus, areas 20 cannot be wetted if hot-melt type adhesive 22 is heated during the heating phase to temperatures above its heating temperature, so that an electrically conductive lateral connection between neighboring strip connectors 12 or neighboring strip connectors 30 is not possible. This makes it possible to achieve a very high resolution for the strip conductors 12 or 30 that are to be contacted.

Figure 4:
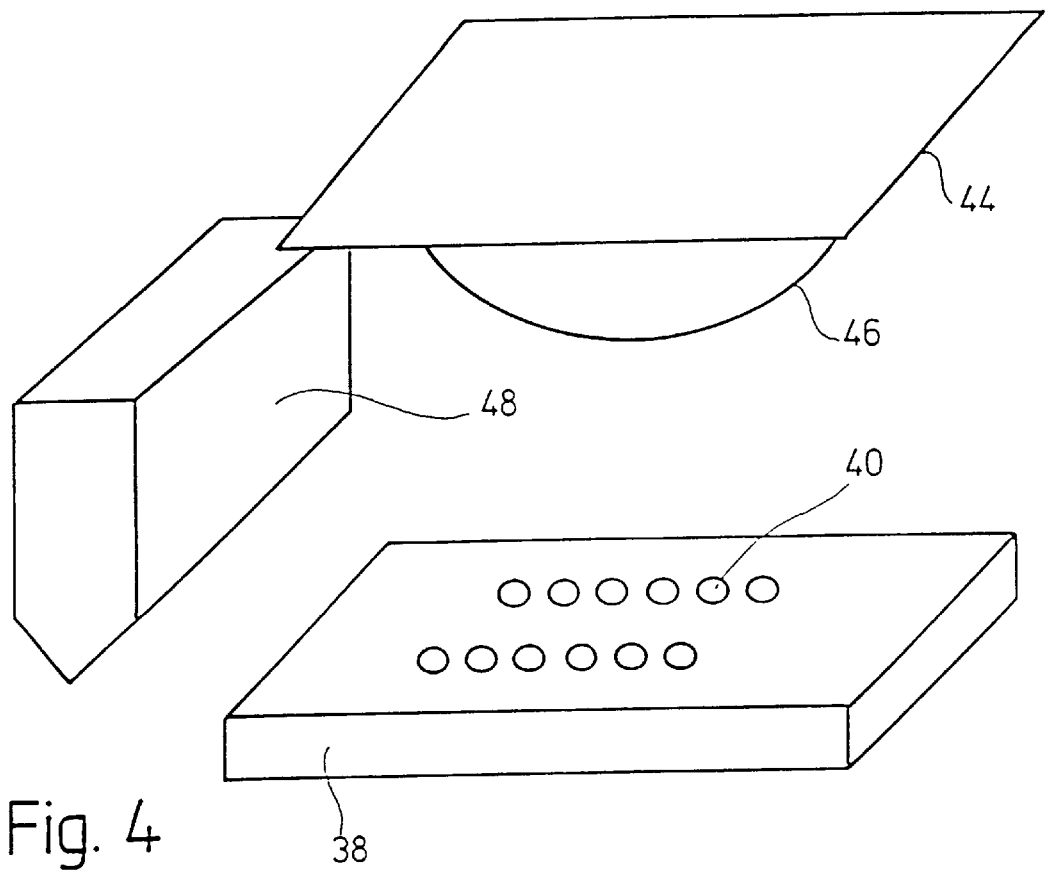
FIG. 4 is a device for applying the hot-melt type adhesive.
Figure 5:
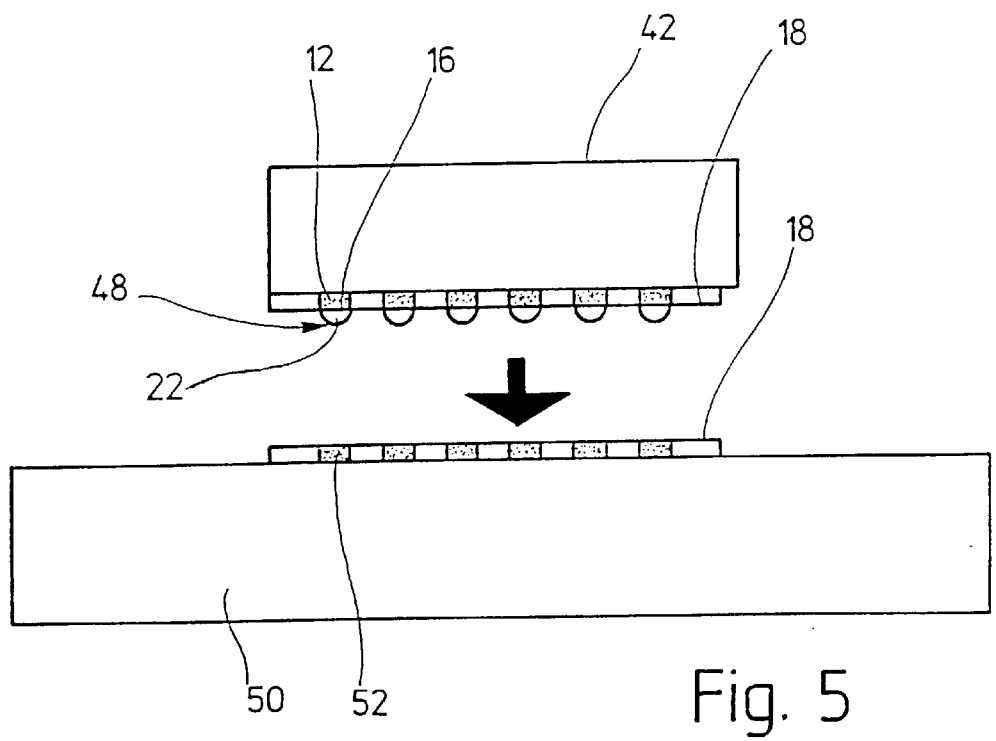
FIG. 5 shows a connection between two elements in accordance with another exemplary embodiment; and, FIG. 6 A connection between two elements according to another exemplary embodiment.

FIGS. 4 and 5 show another exemplary embodiment for the production of an electrically conductive connection. A printing plate 38 with recesses 40 on its surface is provided for this. These recesses 40 are arranged in a certain pattern, which corresponds to the connection pattern of a component 42 that is to be contacted. The component 42 can, for example, be a chip with integrated electronic circuits, for which the connection prongs that lead to the outside predetermine the grid for recesses 40. The printing plate 38 is admitted with a hot-melt type adhesive 22, for example by spraying, printing or a similar method. The recesses are first coated with a lyophobic layer, consisting for example of fluoridated plastic, so that the hot-melt type adhesive 22 cannot stick to the recesses 40.

A wiping knife 48 that is indicated here is run across the printing plate 38, so that the surface of the printing plate 38 is free of hot-melt type adhesive and this adhesive is present only in the recesses, level with the surface of the printing plate 38. Component 42 is subsequently placed over the printing plate 38 so that the contacts of component 42 can engage in the recesses 40. The printing plate 38 can be heated up so that the hot-melt type adhesive melts inside the recesses 40 and can wet the contacts of the component 42. After the printing plate 38 has cooled down, the adhesive in the recesses hardens and adheres to the contacts of component 42. This component can then be removed and now has hot-melt type adhesive at the targeted areas, that is exclusively at its contacts.

Another option for applying the hot-melt type adhesive 22 to the contacts of the component 42 is offered by the so-called tampon print. In this case, a device 44 with a tampon 46 is placed as known per se over the printing plate 38. The tampon 46 consists, for example, of a silicone rubber with smooth surface. The bumps of the hot-melt type adhesive 22 which remain in the recesses 40, cling to the tampon and can be removed from recesses 40 with it. The bumps are then attached to tampon 46 (not shown in FIG. 4) and can be transferred to the contacts for the component 42.

FIG. 5 shows the component 42 with applied hot-melt type adhesive 22, wherein the same reference numbers as in FIGS. 1 to 3 are used here for illustration, despite the different layout. The component 42 thus has the contacts 12 which, at the same time, form the contact areas 16, between which the lyophobic layer 18 is applied. The layer 18 in this case is applied prior to the application of the hot-melt type adhesive to the contacts 12, as explained in FIG. 4. The contacts 12 have hot-melt type adhesive 22, which is shaped to form the contact bumps 48. The component 42 can then be positioned above a substrate 50, wherein the contacts 12 must be contacted with strip conductors 52 that are provided here. A lyophobic layer 18 is again provided between the strip conductors 52. Under the effects of heat, the component 42 is fitted onto the substrate 50, so that the contacts 12 come to rest over strip conductors 52 and an electrically conductive connection is formed by the electrically conductive particles dispersed in the hot-melt type adhesive 22. The forming of the contact bumps 48 at the contacts 12, which is shown here, is only an example. Of course, it is possible to use any other suitable method.

Figure 6:
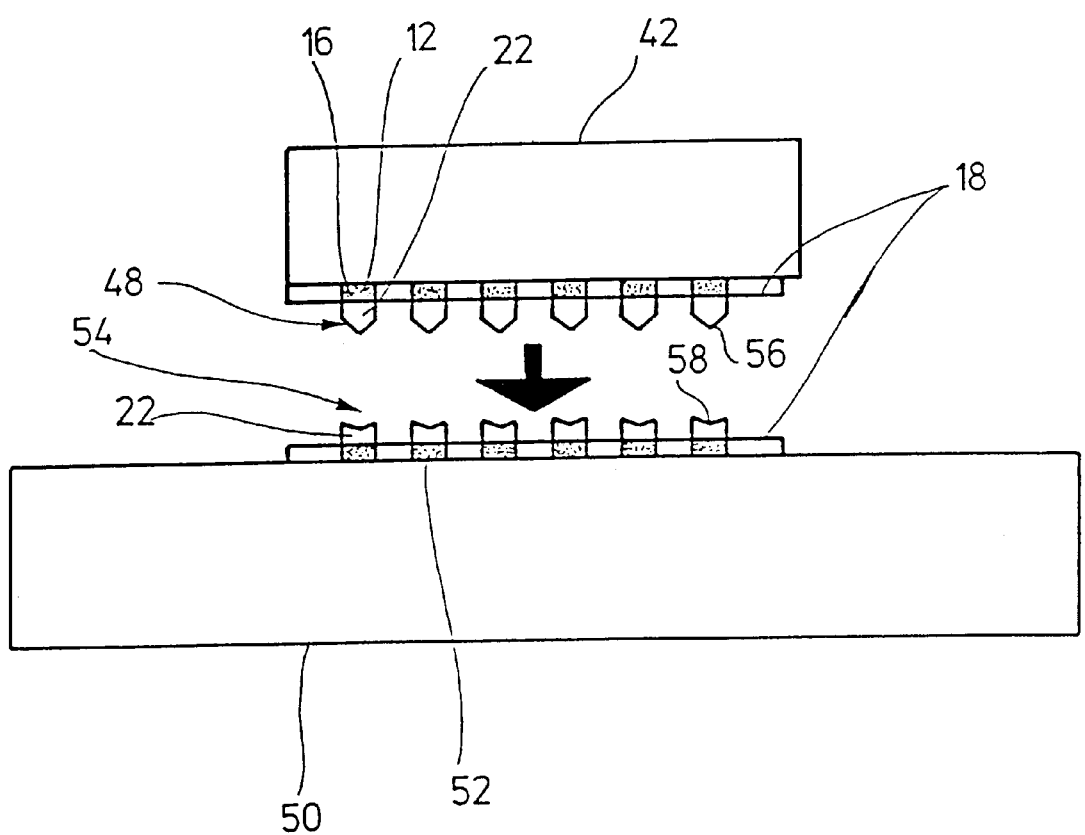

One advantageous embodiment of the invention is shown in FIG. 6. In this case, hot-melt type adhesive 22 is applied to the contact areas 16 of the component 42 as well as the strip conductors 52 of substrate 50. The contact areas 16 here have the contact bumps 48, which are explained in FIGS. 4 and 5 already. Contact bumps 54 are also arranged on the contact areas of the strip conductors 52. The contact bumps 48 and 54 are deformed plastically. The contact bumps 48 have a point 56 that is approximately cone-shaped while the contact bumps 54 have a cone-shaped recess 58, which is approximately adjusted to the point 56. The recesses 58 thus form a negative mold for points 56. The plastic deformation of the contact bumps 48 or 54 can be done with suitable tools, which may have corresponding and, if necessary, heated dies. The plastic deformation of contact bumps 48 or 54 makes it simpler in this case to position the connecting elements, in this case the component 42 and the substrate 50. During the joining of the component 42 to substrate 50, a quasi self-adjustment takes place between contact areas 16 and the strip conductors 52, so that these are arranged exactly on opposite sides. The electrically conductive connection is formed by heating of the hot-melt type adhesive 22 above its melting temperature, so that the electrically conductive particles in the hot-melt type adhesive 22 connect to form an electrically conductive path between the contact areas 16 and strip conductors 52. Following cooling and respective hardening, the base material for the hot-melt type adhesive 22 ensures the mechanical adhesion of component 42 to substrate 50.

We claim:

1. Process for producing an electrically conductive connection between opposite arranged contact areas of two elements that are to be connected, by means of a hot-melt adhesive with electrically conductive particles dispersed in a thermoplastic base material, wherein the hot-melt adhesive is applied to the contact areas of at least one of the elements and these contact areas of the two elements are subsequently joined under the effects of heat, said process comprising: filling recesses, which are provided in a grid pattern corresponding to the contact areas in a surface of a printing plate, bringing the contact areas of said at least one of the elements in direct contact with the recesses that are filled with hot-melt adhesive, adhering the hot-melt adhesive in the recesses to the respective contact areas of the at least one element, subsequently removing the element with hot-melt adhesive adhering to its contact areas from the printing plate, and joining the contact areas with the hot-melt adhesive thereon with associated contact areas of the other element by heating of the hot-melt adhesive to form conductive contacts between the associated contact areas.

2. Process according to claim 1, wherein contact bumps of hot-melt adhesive are produced in the recesses, and these contact bumps are thermally coupled to the contact areas during the step of adhering.

3. Process according to claim 1, further including applying the hot-melt adhesive to the recesses flush with the surface of the printing plate.

4. Process according to claim 1, further comprising removing any hot-melt adhesive which projects over the surface of the printing plate with a wiping knife.

5. Process according to claim 1, further comprising applying a lyophobic layer in the recesses before the hot-melt adhesive is applied.

6. Process for producing an electrically conductive connection between opposite arranged contact areas of two elements that are to be connected, by means of a hot-melt adhesive with electrically conductive particles dispersed in a thermoplastic base material, wherein the hot-melt adhesive is applied to the contact areas of at least one of the elements and these contact areas of the two elements are subsequently joined under the effects of heat, said process comprising: filling recesses, which are provided in a grid pattern corresponding to the contact areas in a surface of a printing plate, with the hot-melt adhesive to form contact bumps in the recesses, removing the contact bumps which are formed in the recesses with hot-melt adhesive from the printing plate and connecting same to respective contact areas of one of the two elements by a tampon printing process, and joining the contact areas with the hot-melt adhesive thereon of said one element with associated contact areas of the other element by heating of the hot-melt adhesive to form conductive contacts between the associated contact areas.

7. Process according to claim 1, further comprising patterning hot-melt adhesives applied on opposite facing contact areas which are to be connected such that a self-adjustment occurs during the joining of the two elements.

* * * * *